United States Patent
Koshiyama et al.

(10) Patent No.: US 8,683,290 B2
(45) Date of Patent: Mar. 25, 2014

(54) SAVE AREA FOR RETAINING CORRECTED DATA

(75) Inventors: Junichi Koshiyama, Tokyo (JP); Kenichi Nakanishi, Tokyo (JP); Keiichi Tsutsui, Tokyo (JP)

(73) Assignee: Sony Corporation, Tokyo (JP)

( * ) Notice: Subject to any disclaimer, the term of this patent is extended or adjusted under 35 U.S.C. 154(b) by 455 days.

(21) Appl. No.: 12/938,768

(22) Filed: Nov. 3, 2010

(65) Prior Publication Data

US 2011/0119558 A1    May 19, 2011

(30) Foreign Application Priority Data

Nov. 16, 2009    (JP) .................................. 2009-260705

(51) Int. Cl.
*H03M 13/00* (2006.01)
*G11C 29/00* (2006.01)

(52) U.S. Cl.
USPC .......................................... 714/758; 714/764

(58) Field of Classification Search
None
See application file for complete search history.

(56) References Cited

U.S. PATENT DOCUMENTS

| | | | | |
|---|---|---|---|---|
| 4,084,236 A | * | 4/1978 | Chelberg et al. | 711/118 |
| 4,920,539 A | * | 4/1990 | Albonesi | 714/764 |
| 4,995,041 A | * | 2/1991 | Hetherington et al. | 714/763 |
| 5,233,616 A | * | 8/1993 | Callander | 714/758 |
| 6,076,183 A | * | 6/2000 | Espie et al. | 714/764 |
| 6,101,614 A | * | 8/2000 | Gonzales et al. | 714/6.1 |
| 7,437,597 B1 | * | 10/2008 | Kruckemyer et al. | 714/6.11 |
| 2005/0044467 A1 | * | 2/2005 | Leung et al. | 714/763 |
| 2009/0319865 A1 | * | 12/2009 | Kanai et al. | 714/758 |

FOREIGN PATENT DOCUMENTS

| | | |
|---|---|---|
| JP | 63-271555 | 11/1988 |
| JP | 05-006313 | 1/1993 |
| JP | 3068009 | 5/2000 |

* cited by examiner

*Primary Examiner* — Gabriel Chu
(74) *Attorney, Agent, or Firm* — Sony Corporation

(57) ABSTRACT

Disclosed herein is a nonvolatile memory, including: a memory area including a data area configured to retain data and an error correction code area configured to retain an error correction code known as ECC; and a control unit configured to control access to the memory area. The control unit includes an error detection and correction function configured to detect an error in the data read from the data area and to correct the detected error, at least one save area configured such that if data at a designated address and ECC corresponding thereto are read from the memory area and if an error is detected, then the save area retaining the address and correct data corresponding thereto, and a validity presentation block configured to indicate whether or not the address and the correct data retained in the save area are valid.

20 Claims, 9 Drawing Sheets

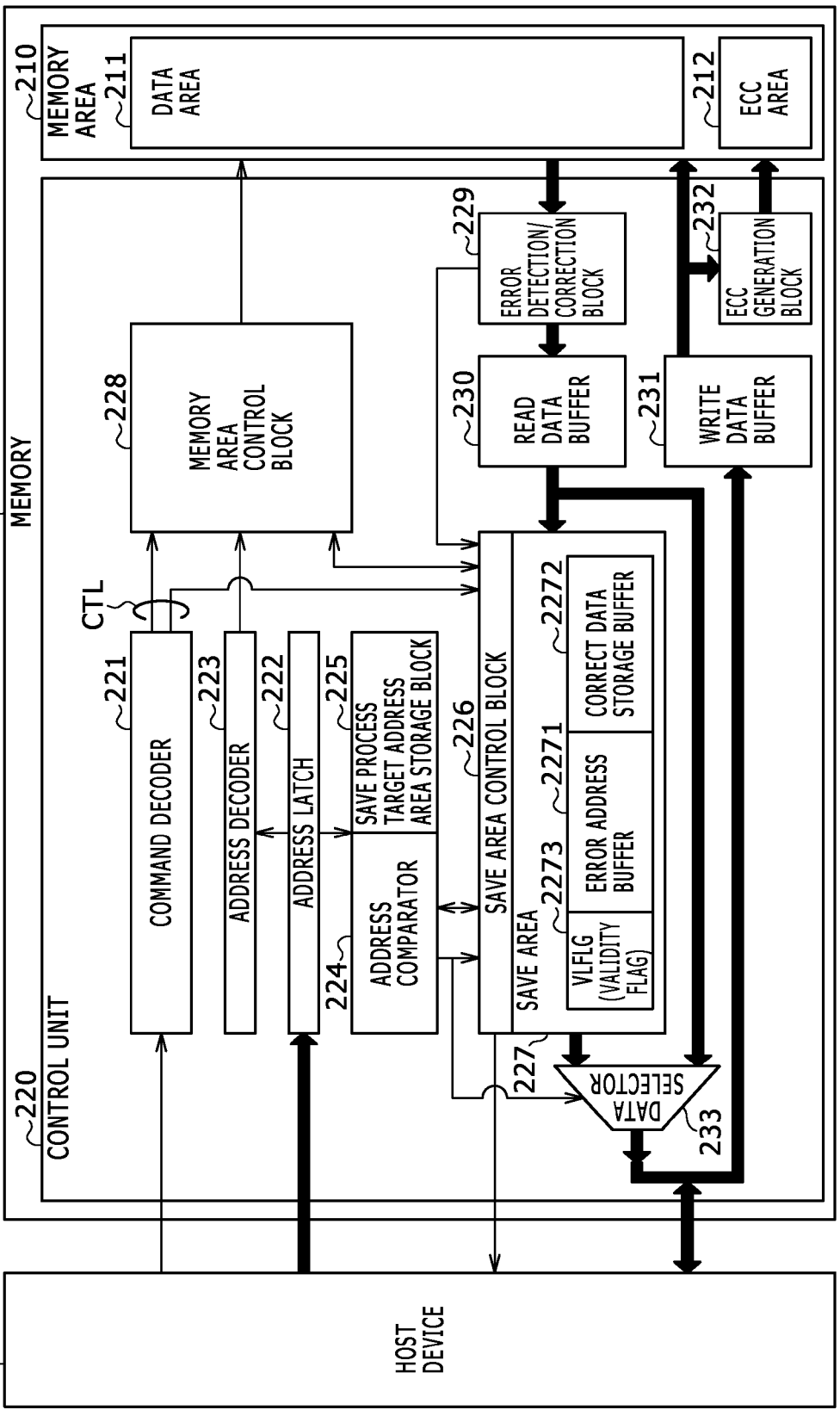

FIG. 2

| CMD: COMMAND | COMMAND OPERATION |
|---|---|
| RD: Read | READ FROM MEMORY AREA |
| WRT: Write | WRITE TO MEMORY AREA |
| CAS: Correct_address_set | SET SAVE PROCESS TARGET ADDRESS |
| CAR: Correct_address_reset | RESET SAVE PROCESS TARGET ADDRESS |
| CD: Correct_data | WRITE BACK CORRECT DATA |
| SCD: Stop_correct_data | STOP WRITE-BACK COMMAND |

| 2121 | 2122 |
|---|---|
| SVFLG | ECC 1 |
| SVFLG | ECC 2 |
| SVFLG | ECC 3 |
| SVFLG | ECC 4 |
| ⋮ | ⋮ |
| SVFLG | ECC n |

SVFLG : SAVE FLAG

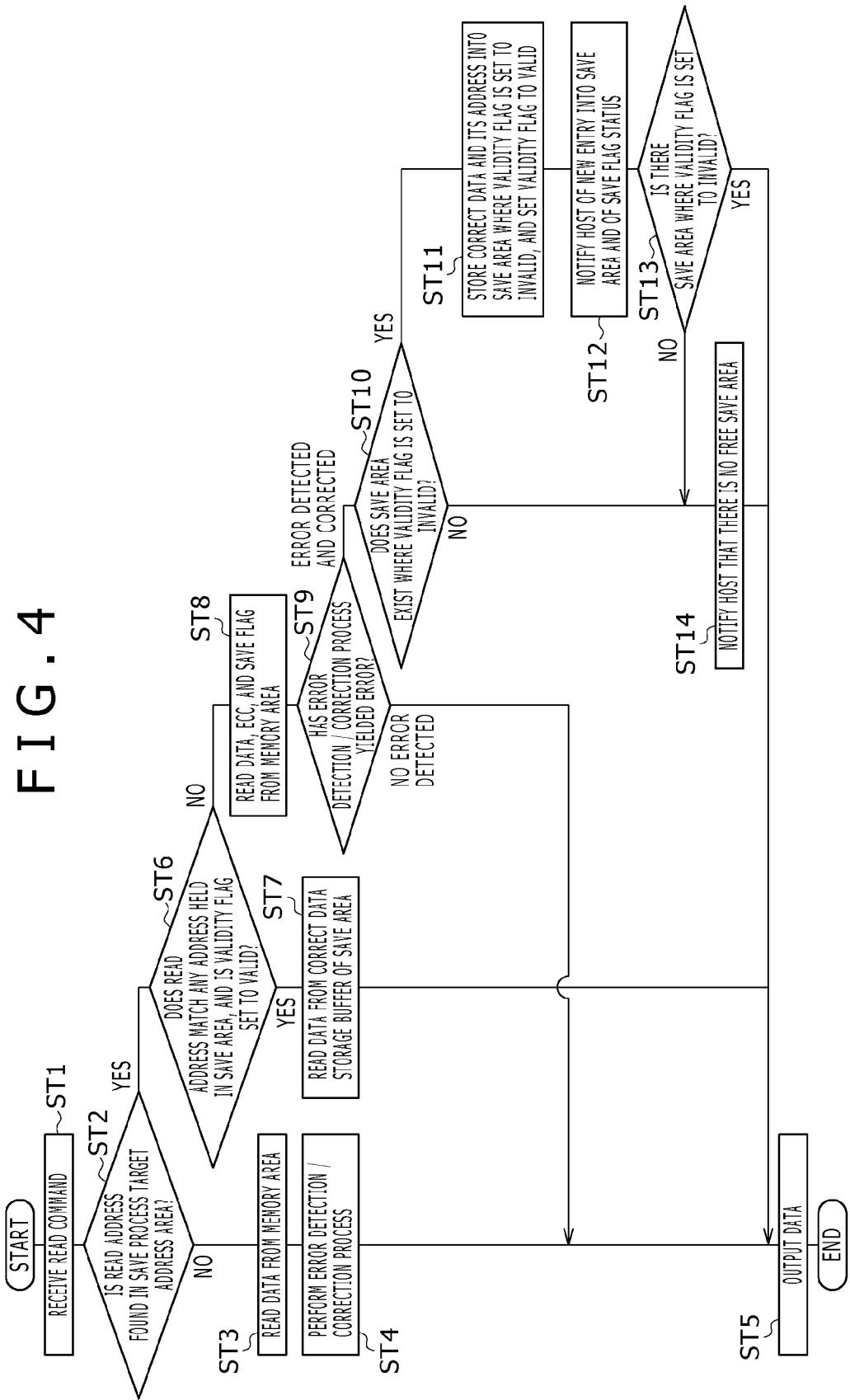

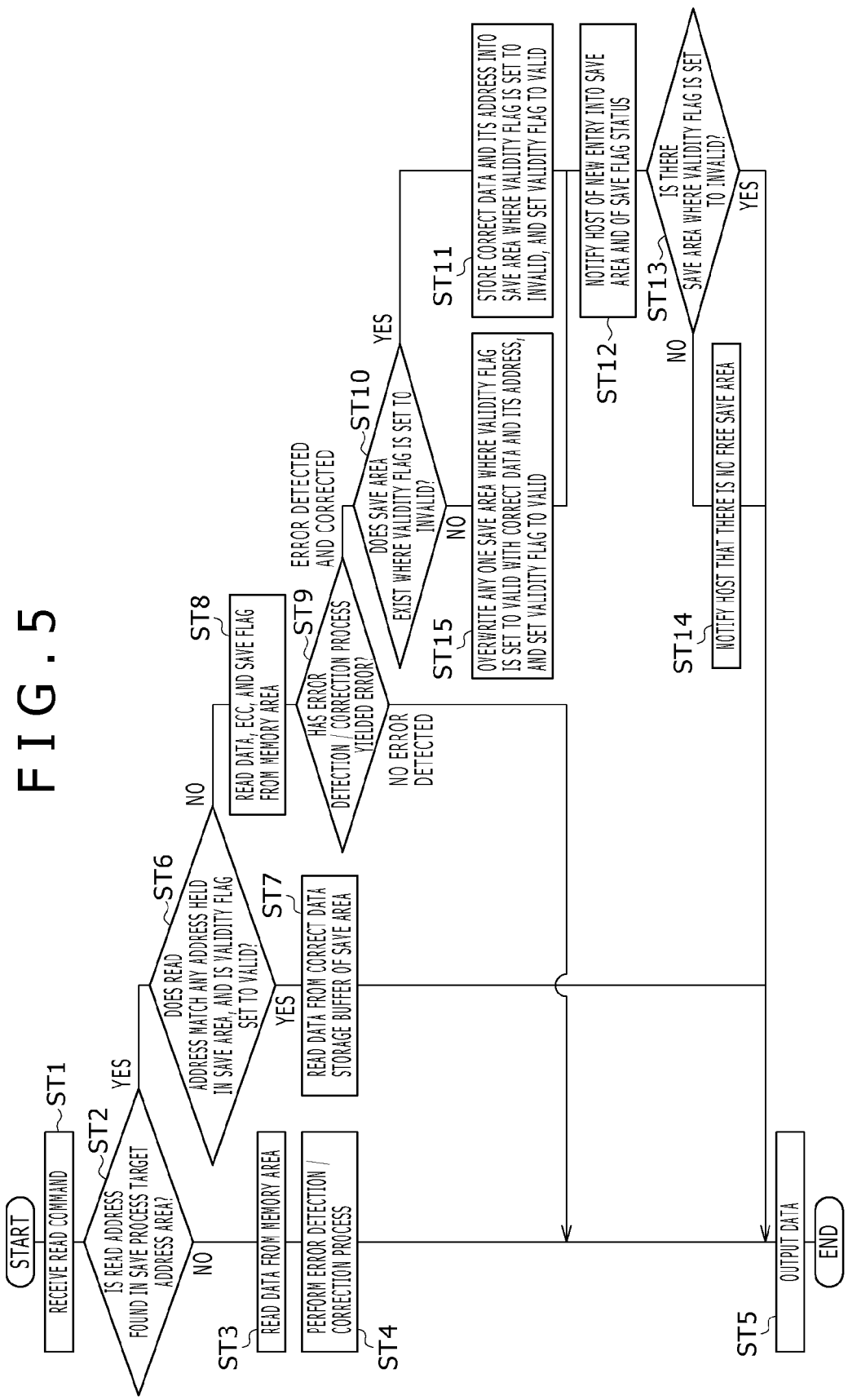

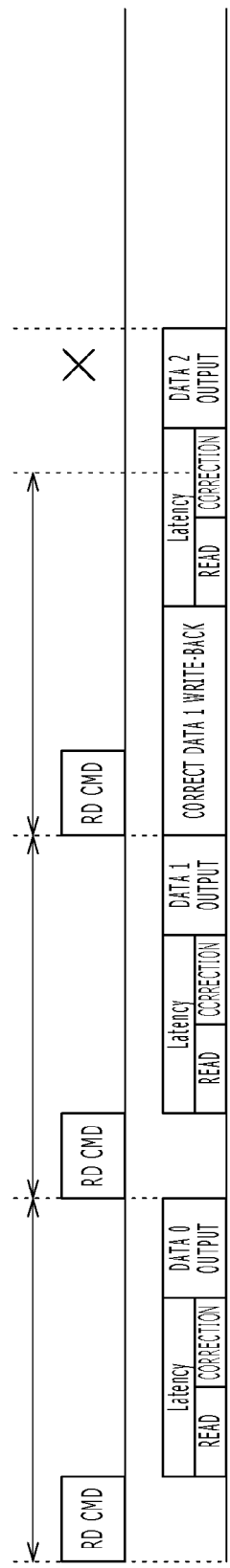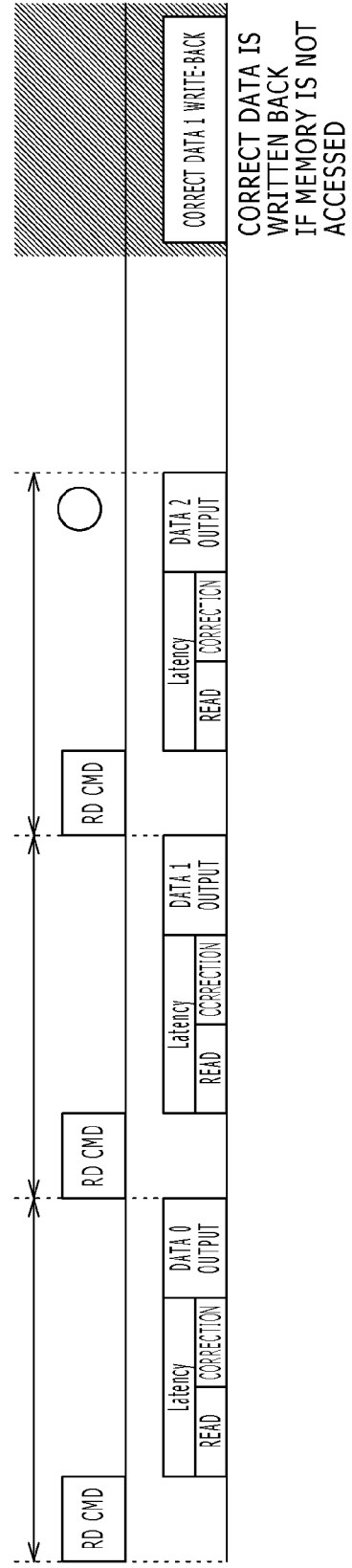

FIG.11A

| ADDRESS | CORRECTION |
|---|---|
| 0x00000000 | NECESSARY |
| 0x00042000 | UNNECESSARY |
| 0x00042100 | UNNECESSARY |
| 0x00041000 | NECESSARY |
| 0x00040800 | NECESSARY |
| 0x00000080 | UNNECESSARY |
| 0x00000100 | UNNECESSARY |
| 0x00000180 | UNNECESSARY |
| 0x00001000 | UNNECESSARY |

SEQUENCE OF ACCESS TO MEMORY →

ADDRESS
0x00100000 — FREQUENTLY UPDATED DATA
0x00040000 — READ ONLY DATA
0x00000000

SAVE TARGET ADDRESS

[FOUR SAVE AREAS]

| VALIDITY FLAG | WRITE-BACK ADDRESS | CORRECT DATA |
|---|---|---|
| 1 | 0x00000000 | 0x01234567 |
| 1 | 0x00042100 | 0x12345678 |
| 1 | 0x00040800 | 0x3456789A |
| 1 | 0x00000080 | 0x456789AB |

FIG.11B

| ADDRESS | CORRECTION |
|---|---|
| 0x00000000 | NECESSARY |
| 0x00042000 | UNNECESSARY |
| 0x00042100 | NECESSARY |
| 0x00041000 | NECESSARY |
| 0x00040800 | NECESSARY |
| 0x00000080 | NECESSARY |
| 0x00000100 | UNNECESSARY |
| 0x00000180 | UNNECESSARY |
| 0x00001000 | UNNECESSARY |

SEQUENCE OF ACCESS TO MEMORY →

ADDRESS
0x00100000 — FREQUENTLY UPDATED DATA
0x00040000 — READ ONLY DATA
0x00000000

SAVE TARGET ADDRESS

[FOUR SAVE AREAS]

| VALIDITY FLAG | WRITE-BACK ADDRESS | CORRECT DATA |
|---|---|---|
| 1 | 0x00000000 | 0x01234567 |
| 1 | 0x00000080 | 0x456789AB |
| | | |
| | | |

SAVE AREA FOR RETAINING CORRECTED DATA

BACKGROUND OF THE INVENTION

1. Field of the Invention

The present invention relates to a nonvolatile memory and a memory system having an error correction capability.

2. Description of the Related Art

Nonvolatile memories are characterized by their ability to retain stored contents therein when power is removed. It is therefore important for the stored data in the memory to stay reliable.

Many nonvolatile memories have more trouble letting stored data be read out correctly therefrom the more often the data has been retrieved after it was written thereto and the longer the data has been retained therein. The repeated data readout and prolonged data retention can deteriorate the stored data and lead to bit errors thereof.

The bottleneck above has been bypassed so far by writing error correction code (ECC) along with data upon storage. At read time, error detection and correction processes are carried out to improve the reliability of the retrieved data.

As an example of the error occurrence probability for nonvolatile memories, two bit error rates of 8-gigabit NAND flash memories are cited by N. Mielke, T. Marquart, N. Wu, J. Kessenich, H. Beigal, E. Schares, F. Trivedi, E. Goodness, and Leland R. Nevill in "Bit Error Rate in NAND Flash Memories," IEEE CFPO8RPS-DCR, 46th Annual International Reliability Physics Symp., 2008 (hereinafter as Non-Patent Document). The document also discusses bit error rates relative to data retention periods and data retrieval frequencies.

One of the bit error rates cited in the Non-Patent Document above concerns memory cells on which maximum allowable rewrites were performed. The bit error rate of these memory cells upon elapse of 2,000 hours was shown to be about 1.0E-7.

Another bit error rate cited in the Non-Patent Document above concerns memory cells on which maximum allowable rewrites were also carried out. The bit error rate of these memory cells following read operations repeated 10,000 times was also shown to be about 1.0E-7.

When data is written back to those cells of the nonvolatile memory that developed the aforementioned data errors, the data retention period of the memory is reset. This renders the nonvolatile memory refreshed to have data written thereto and read therefrom correctly again. The process of writing back correct data to the nonvolatile memory is an effective way to prolong the data retention period of the memory in question.

SUMMARY OF THE INVENTION

Viewed from a host device, however, the data write-back process is a process that takes place unexpectedly at data read time. As such, the data write-back process is a factor that can prevent the host device from accessing the memory of interest.

In particular, an application that requests data readout from the memory at a constant data rate has trouble dealing with the data write-back process.

If the readout of data from the memory cells retaining erroneous data is repeated, data deterioration can be promoted and uncorrectable errors are more likely to occur.

Japanese Patent No. 3068009 (hereinafter as Patent Document 1) discloses a technique constituting a countermeasure against soft errors.

According to this technique, if a correctable error occurs, the address corresponding to the error and the correct data associated therewith are held in a buffer. The correct data is retrieved from the buffer only if an uncorrectable error has occurred in the data read from the same address.

With the technique disclosed in the Patent Document 1, however, the correct data cannot be written back to the memory cells when the data error has occurred.

Japanese Patent Laid-open No. Sho 63-271555 (hereinafter as Patent Document 2) also discloses a technique constituting a countermeasure against soft errors.

According to this technique, when data is read from a main memory into a cache memory and if ECC has developed an error, a correction bit is set to indicate the occurrence of a correction. When the data is evacuated from the cache memory, the data in the main memory is corrected if the correction bit is found set.

With the technique disclosed in the Patent Document 2, however, only the data to be read from the main memory into the cache memory of the CPU is subject to correction; any other data in the main memory cannot be corrected.

Japanese Patent Laid-open No. Hei 5-6313 (hereinafter as Patent Document 3) discloses a technique which, if there is an error in the data read from a memory, allows correct data and its address to be retained in a buffer so that the data may be written back to the memory upon completion of access by a processor.

With the technique disclosed in the Patent Document 3, however, upon access to the address holding the correct data at data read time, it is always from the memory cells that the data is read out; the correct data in the buffer is not retrieved.

When access to the memory cells is repeated, data deterioration will progress and an uncorrectable error can eventually occur. In this case, the system cannot continue its operation and comes to a stop because of the uncorrectable error. The system is then required to perform a write-back process.

The present invention has been made in view of the above circumstances and provides a nonvolatile memory and a memory system which, if a read operation is performed on the same address as that of saved data, can output the correct data that has been saved.

In carrying out the present invention and according to one embodiment thereof, there is provided a nonvolatile memory including: a memory area including a data area configured to retain data and an error correction code area configured to retain an error correction code known as ECC; and a control unit configured to control access to the memory area. The control unit includes: an error detection and correction function configured to detect an error in the data read from the data area and to correct the detected error; at least one save area configured such that if data at a designated address and ECC corresponding thereto are read from the memory area and if an error is detected, then the save area retaining the address and correct data corresponding thereto; and a validity presentation block configured to indicate whether or not the address and the correct data retained in the save area are valid. If a new address and correct data are entered into the save area, then the control unit sets the validity presentation block to valid; and if the data retained in the save area becomes unnecessary, then the control unit sets the validity presentation block to invalid.

According to another embodiment of the present invention, there is provided a memory system including: a memory area including a data area configured to retain data and an error correction code area configured to retain an error correction code known as ECC; a control unit configured to control access to the memory area; and a host device including at least a function configured to designate the control unit to perform a read operation, and a function configured to designate the control unit to perform a write operation. The control unit includes: an error detection and correction function configured to detect an error in the data read from the data area and to correct the detected error; at least one save area configured such that if data at a designated address from the host device and ECC corresponding thereto are read from the memory area and if an error is detected, then the save area retaining the address and correct data corresponding thereto; and a validity presentation block configured to indicate whether or not the address and the correct data retained in the save area are valid. If a new address and correct data are entered into the save area, then the control unit sets the validity presentation block to valid; and if the data retained in the save area becomes unnecessary, then the control unit sets the validity presentation block to invalid.

According to the present invention embodied as outlined above, if a read occurs at the same address as that of saved data, then correct data that has been saved there can be output.

BRIEF DESCRIPTION OF THE DRAWINGS

FIG. 1 is a block diagram showing a typical configuration of a memory system adopting a nonvolatile memory embodying the present invention;

FIG. 2 is a tabular view listing typical commands issued by a host device constituting part of the embodiment of the invention;

FIG. 3 is a schematic view showing a typical formation of an ECC area constituting part of the embodiment of the invention;

FIG. 4 is a flowchart explanatory of how the nonvolatile memory embodying the invention operates upon receipt of a read command, with saved data not overwritten;

FIG. 5 is a flowchart explanatory of how the nonvolatile memory embodying the invention operates upon receipt of the read command, with saved data overwritten;

FIGS. 9A and 9B are schematic views showing how, as opposed to ordinary systems, a memory system embodying the present invention can minimize the adverse effect of a write-back process on system performance without reducing ameliorating effects on data retention characteristics;

FIGS. 11A and 11B are schematic views comparing the case where all correct data are written back, with the case where correct data at only designated addresses are written back.

DETAILED DESCRIPTION OF THE PREFERRED EMBODIMENTS

Figure 6:
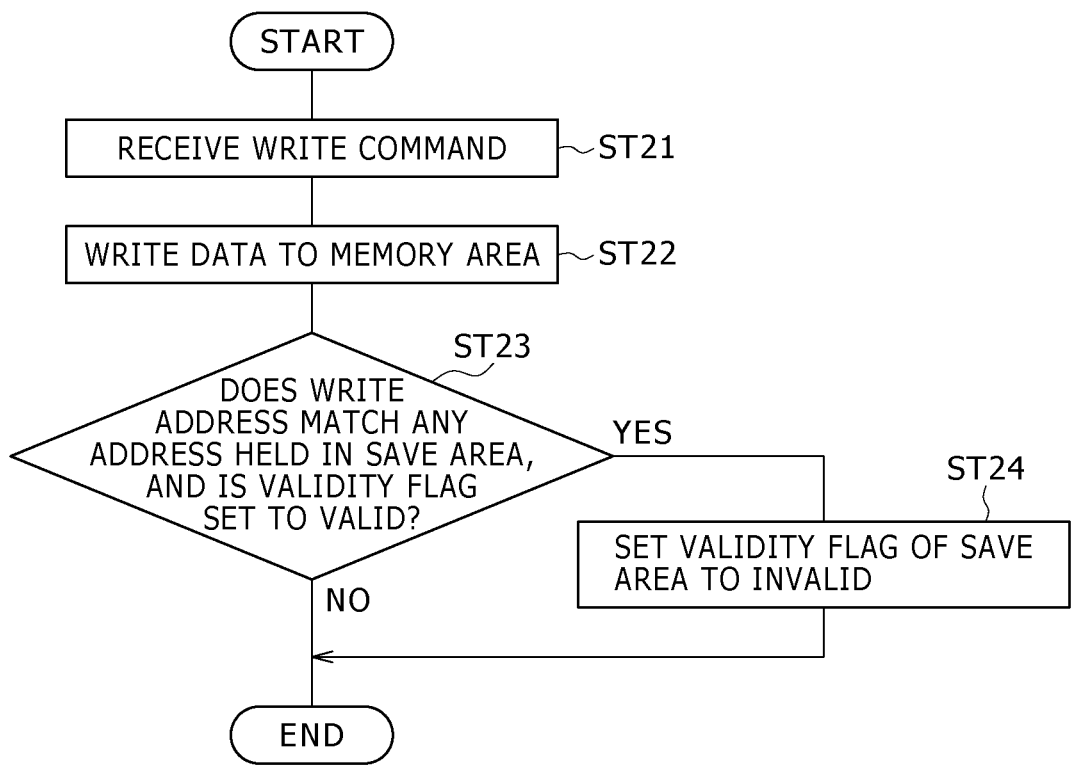
FIG. 6 is a flowchart explanatory of how the nonvolatile memory embodying the invention operates upon receipt of a write command.

Some preferred embodiments of the present invention will now be described in reference to the accompanying drawings under the following headings:
1. Overall configuration of memory system
2. Operations upon receipt of read command
3. Operations upon receipt of write command
4. Operations upon receipt of save process target address set command
5. Operations upon receipt of correct data write-back command <1. Overall Configuration of Memory System>

FIG. 1 shows a typical configuration of a memory system 10 adopting a nonvolatile memory 200 embodying the present invention.

The memory system 10 embodying the invention is structured to include a host device 100 and the nonvolatile memory 200.

The host device 100 is connected to the nonvolatile memory 200 and controls the latter in write and read operations.

The nonvolatile memory 200 is made up of a memory area 210 and a control unit 220. Under control of the control unit 220, the memory area 210 records data, ECCs, and save flags SVFLG.

The control unit 220 receives a command CMD from the host device 100 and writes or read data to or from the memory area 210 according to the received command CMD.

FIG. 2 lists typical commands issued by the host device 100 constituting part of the embodiment of the invention.

The commands CMD issued by the host device 100 include a read command RD, a write command WRT, a save process target address set ("Correct_address_set") command CAS, a save process target address reset ("Correct_address_reset") command CAR, a correct data write-back ("Correct_data") command CD, and a write-back stop ("Stop_correct_data") command SCD.

On receiving the read command RD, the control unit 220 performs a read from the memory area 210.

Upon receipt of the write command WRT, the control unit 220 performs a write to the memory area 210.

When receiving the save process target address set command CAS, the control unit 220 sets a save process target address.

On getting the save process target address reset command CAR, the control unit 220 resets the save process target address.

When getting the correct data write-back command CD, the control unit 220 writes correct data back to the memory area 210.

Upon receipt of the write-back stop command SCD, the control unit 220 stops execution of the write-back command.

The memory area 210 is formed by a data area 211 and an ECC area 212.

In the memory area 210, write data is written to the data area 211; at read time, data is read from the data area 211.

In the ECC area 212, an ECC and a save flag SVFLG are recorded corresponding to each data item.

FIG. 3 shows a typical formation of the ECC area 212 constituting part of the embodiment of the invention.

As indicated in FIG. 3, the ECC area 212 is constituted by save flag fields 2121 each recording a save flag SVFLG and by ECC fields 2122 each recording an ECC.

The control unit 220 includes a command decoder 221, an address latch 222, an address decoder 223, an address comparator 224, a save process target address area storage block 225, a save area control block 226, a save area 227, and a memory area control block 228.

The control unit 220 further includes an error detection/correction block 229, a read data buffer 230, a write data buffer 231, an ECC generation block 232, and a data selector 233.

The command decoder 221 decodes the command CMD coming from the host device 100. Following the decoding, the command decoder 221 sends a control signal CTL reflecting the decoded command to the memory area control block 228 as well as to the save area control block 226.

The address latch 222 is a register that latches the input address. The address latch 222 outputs the latched address to the address decoder 223 and address comparator 224.

The address decoder 223 decodes the address latched by the address latch 222. Following the decoding, the address decoder 223 gives the memory area control block 228 the address location of the memory area 210 to be accessed.

The address comparator 224 compares the address to be accessed with all addresses which are recorded in the save area 227 and for which a validity flag VLFLG as the validity presentation block is set to valid each. The address comparator 224 outputs the result of the comparison to the save area control block 226 and data selector 233.

The save process target address area storage block 225 retains a range of addresses at which to carry out a series of processes for saving correct data into the save area 227 when data corrections are performed.

The save area control block 226 controls data write and read operations to and from the save area 227. The save area control block 226 has the function of notifying the host device 100 every time any correct data and its address are added anew to the save area 227. The control block 226 further has the function of notifying the host device 100 of any free save area that has become available.

The save area 227 is made up of an error address buffer 2271, a correct data storage buffer 2272, and a validity flag block 2273. At least one data item and its address are recorded in the save area 227. The number of correct data items together with their addresses that may be recorded concurrently in the save area 227 is determined by two factors: the size of the data to be accessed until the host device 100 starts a write-back process, and the occurrence ratio of correctable errors.

The probability of correctable errors is obtained by subtracting the probability of uncorrectable errors from the bit error rate (BER) in effect. Given the fact that the probability of uncorrectable error taking place is negligible compared with the probability of correctable errors, the probability of correctable errors is regarded as virtually the same as the bit error rate.

Consider the above-cited NAND flash memory subjected to maximum allowable rewrites. The BER (bit error rate) observed upon elapse of 2,000 hours was shown to be 1.0E-7. If the size of the data to be accessed before the start of the write-back process is assumed to be "X" MB, then the number of correct data items together with their save addresses is given as "0.8*X."

Suppose that each photo taken by a digital still camera has a size of several MB and that a data write-back process is performed every time one photo is retrieved from the memory of the camera. In such a case, even if the memory is used until the allowable rewrite count expires, only about 10 correct data items along with their addresses need to be established as the correct data count for recording to the save area 227.

The memory area control block 228 controls write and read operations to and from the memory area 210 in accordance with the control signal CTL issued by the command decoder 221.

The error detection/correction block 229 detects errors from the data retrieved from the memory area 210 and corrects the detected errors.

The read data buffer 230 admits correct data coming from the error detection/correction block 229.

The read data buffer 230 outputs buffered data to the save area 227 and data selector 233.

The write data buffer 231 buffers data that is input from an external I/O device, and outputs the buffered data to the data area 211 and ECC generation block 232.

The ECC generation block 232 generates an error correction code (ECC) from the data input from the write data buffer 231, and outputs the generated ECC to the ECC area 212.

The data selector 233 outputs the data coming from the correct data storage buffer 2272 of the save area 227 if the address comparator 224 indicates a match between the addresses. The data selector 233 outputs the data coming from the read data buffer 230 if the address comparator 224 indicates a mismatch between the addresses.

What follows is an explanation of how the nonvolatile memory 200 operates when a read command is received as well as when a write command is received.

<2. Operations Upon Receipt of Read Command>

FIG. 4 is a flowchart explanatory of how the nonvolatile memory 200 embodying the invention operates upon receipt of a read command, with saved data not overwritten.

[Read Operation (with Saved Data not Overwritten)]

In the nonvolatile memory 200, the control unit 220 receives the read command RD issued by the host device 100 (in step ST1).

The read command RD thus received is decoded by the command decoder 221. In turn, the command decoder 221 transmits a control signal CTL reflecting the decoded command to the memory area control block 228 and save area control block 226.

A read address is latched by the address latch 222. The latched read address is fed to the address decoder 223 and address comparator 224.

The address decoder 223 decodes the address latched by the address latch 222. The address decoder 223 gives the memory area control block 228 the address location of the memory area 210 to be accessed as per the decoded address.

The address comparator 224 compares the address to be accessed with all addresses which are recorded in the save area 227 and for which the validity flag VLFLG is set to valid each (in step ST2). The result of the comparison is output to the save area control block 226 and data selector 233. In step ST2, a check is made to determine whether or not the read address is a save process target address.

If in step ST2 the read address is determined not to be the save process target address, then the memory area control block 228 reads the data and ECC from that address location of the data area 211 which is designated by the address decoder 223 (in step ST3).

The read data is corrected by the error detection/correction block 229 (in step ST4) before being input to the read data buffer 230. From the read data buffer 230, the data is output to an external I/O device through the data selector 233 (in step ST5).

If in step ST2 the read address is determined to be a save process target address, then the address comparator 224 compares the read address with all addresses which are held in the error address buffer 2271 of the save area and for which the validity flag VLFLG is set to valid each (in step ST6). A check is made in this step to determine whether there exists any validity flag VLFLG that is set to valid.

If in step ST6 a matching address is determined to exist, then the save area control block 226 outputs the correct data at the matching address from the save area 227 to the data selector 233. In turn, the data selector 233 outputs the correct data coming from the save area 227 to the external I/O device (in step ST7).

If in step ST6 no matching address is determined to exist, then the memory area control block 228 causes data to be read from the data area 211 and the ECC and save flag SVFLG to be read from the ECC area 212 (in step ST8).

The retrieved data is input to the read data buffer 230 through the error detection/correction block 229 (in step ST9). If in step ST9 the error detection/correction block 229 determines that there is no error, then the data in the read data buffer 230 is output to the external I/O device through the data selector 233 (in step ST5).

If in step ST9 an error is detected in the read data, then the correct data and its address in the read data buffer 230 are saved into the save area 227. At this point, the following steps are carried out.

The save area control block 226 checks to determine whether there is a save area 227 where the validity flag VLFLG is set to invalid (in step ST10).

If in step ST10 it is determined that there exists a save area 227 where the validity flag VLFLG is set to invalid, then the correct data and its address are stored into that save area 227 where the validity flag VLFLG is set to invalid. The validity flag VLFLG is then set to valid (in step ST11). The host device 100 is notified of validity flag status in addition to the fact that new save data has been entered into the save area 227 (in step ST12).

From the status of the save flags SVFLG, the host device 100 can determine whether the newly entered save data occurred earlier at the same address.

Depending on the circumstances, the host device 100 may determine that the memory cell of that address is a defective cell to be discontinued for further use.

It may be determined that there is no save area 227 where the validity flag VLFLG is set to invalid either before the correct data and its address are stored into the save area (in step ST10) or after the correct data and its address are entered into the save area (step ST13). In that case, the host device 100 is informed that there is no free save area (step ST14).

[Read Operation (with Save Data Overwritten)]

FIG. 5 is a flowchart explanatory of how the nonvolatile memory embodying the invention operates upon receipt of the read command, with saved data overwritten.

The processing in FIG. 5 differs from that in FIG. 4 in that the negative result of the determination in step ST10 is followed by step ST15 before step ST12 is carried out.

In step ST15, any one save areas 227 where the validity flag VLFLG is set to valid is overwritten with the correct data and its address and the validity flag VLFLG is set to valid. Then the above-described step ST12 is reached.

<3. Operations Upon Receipt of Write Command>

FIG. 6 is a flowchart explanatory of how the nonvolatile memory embodying the invention operates upon receipt of a write command.

In the nonvolatile memory 200, the control unit 220 receives the write command WRT issued by the host device 100 (in step ST21).

The write command WRT thus received is decoded by the command decoder 221. In turn, the command decoder 221 sends a control signal CTL reflecting the decoded command to the memory area control block 228 and save area control block 226.

A write address is latched by the address latch 222. The latched write address is fed to the address decoder 223 and address comparator 224. The address decoder 223 decodes the address latched by the address latch 222, and gives the memory area control block 228 the address location of the memory area 210 to be accessed.

An external I/O device inputs write data to the write data buffer 231. The ECC generation block 232 generates an ECC.

Under control of the memory area control block 228 instructed to perform a write by the command decoder 221, the data is written to the address location designated by the address decoder 223 (in step ST22).

The address comparator 224 compares for a match the write address with all addresses which are held in the save areas 227 and for which the validity flag VLFLG is set to valid each (in step ST23).

If there is a match in step ST23, then the save area control block 226 sets to invalid the validity flag VLFLG of the save area corresponding to the matching address (in step ST24).

<4. Operations Upon Receipt of Save Process Target Address Set Command>

Figure 7:
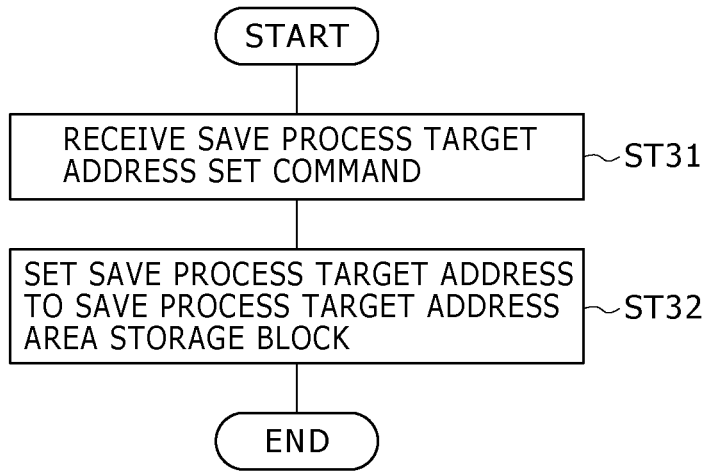
FIG. 7 is a flowchart showing how the nonvolatile memory embodying the invention operates upon receipt of a save process target address set command ("Correct_address_set")

FIG. 7 is a flowchart showing how the nonvolatile memory embodying the invention operates upon receipt of a save process target address set ("Correct_address_set") command.

In the nonvolatile memory 200, the control unit 220 receives the save process target address set ("Correct_address_set") command CAS issued by the host device 100 (in step ST31).

The data transmitted along with the command CAS represents a save process target address. The save process target address is latched by the address latch 222, before being set to the save process target address area storage block 225 (in step ST32).

<5. Operations Upon Receipt of Correct Data Write-Back Command>

Figure 8:
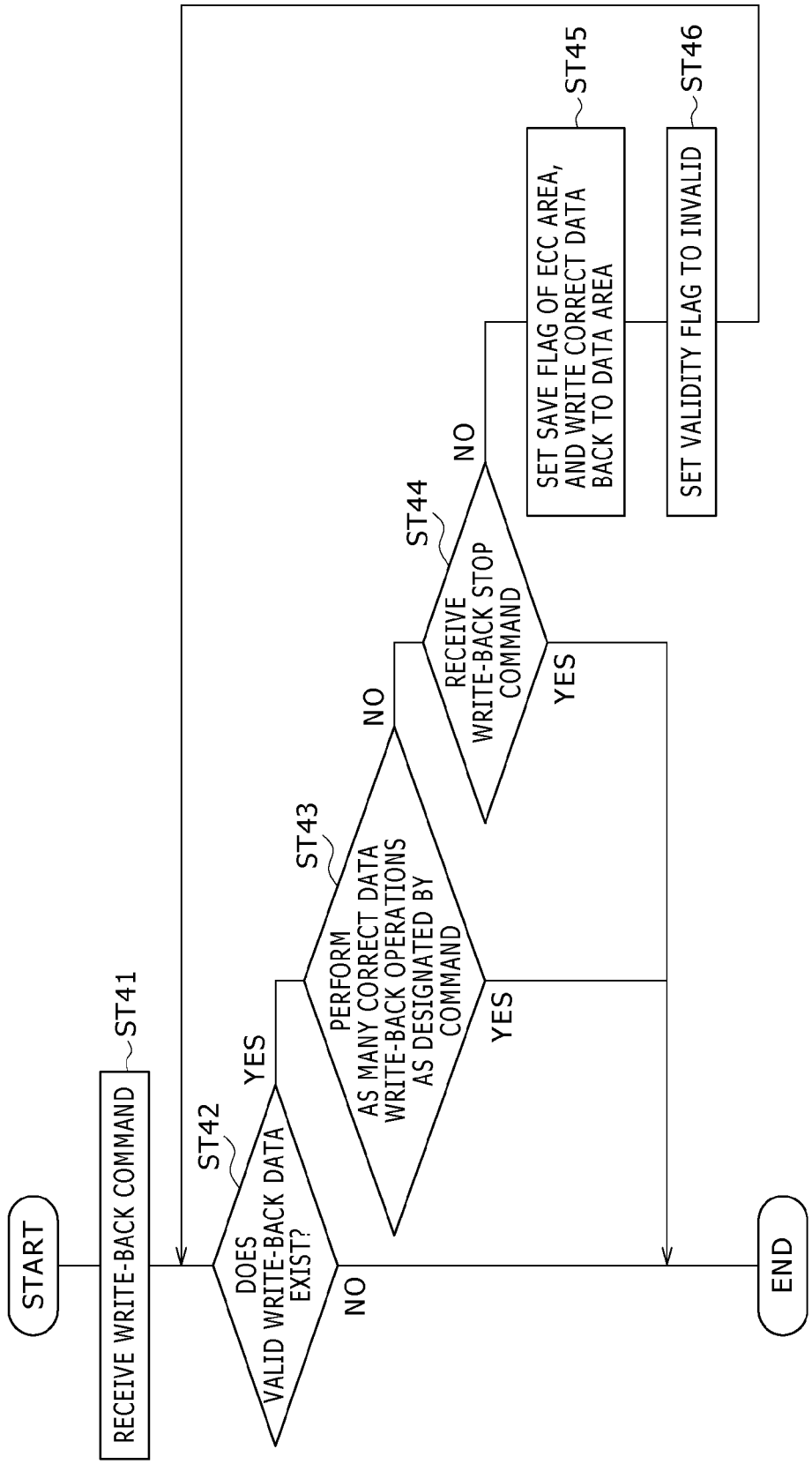
FIG. 8 is a flowchart showing how the nonvolatile memory embodying the invention operates upon receipt of a correct data write-back ("Correct_data") command.

FIG. 8 is a flowchart showing how the nonvolatile memory embodying the invention operates upon receipt of a correct data write-back ("Correct_data") command.

In the nonvolatile memory 200, the control unit 220 receives the correct data write-back ("Correct_data") command issued by the host device 100 (in step ST41).

The command thus received is decoded by the command decoder 221. In turn, the command decoder 221 sends a control signal CTL reflecting the decoded command to the memory area control block 228 and save area control block 226.

The save area control block 226 checks to see if any validity flag VLFLG is being set, thereby determining whether there is any valid write-back data (in step ST42).

If in step ST42 no validity flag VLFLG is found to be set, then the processing is brought to an end.

If any validity flag VLFLG is found set, then a check is made to determine whether a write-back of as many correct data as designated by the command with the validity flag VLFLG set to valid each has been carried out (in step ST43).

If the designated number of correct data is zero, then all correct data with the validity flag VLFLG set to valid each are written back.

After the write-back of as many data as designated by the command has been carried out, the processing is terminated.

It might happen that the write-back stop ("Stop_correct_data") command SCD is received before the write-back of as many data as designated is complete (in step ST44). If that happens, then the correction processing is terminated.

If in step ST44 the write-back stop ("Stop_correct_data") command SCD has yet to be received, the following steps are carried out.

The save flag SVFLG of the ECC area 212 is set, and the correct data is written back to the data area 211 (in step ST45). After the write-back, the validity flag VLFLG is set to invalid (in step ST46). If there exists any further save area 227 where the validity flag VLFLG is set to valid, then the above steps are repeated.

The embodiment of the present invention discussed above offers the following major benefits.

The save areas are provided to retain the address and data of any memory cell where a correction occurred as a result of a read request issued by the host device 100. With the saved addresses and data thus managed inside the memory, there is no need for the host device 100 to be equipped with the function of managing information about the memory cells where corrections have taken place.

If there is a match between the address of the read request from the host 100 and any of the addresses saved in the save areas 227, the data is read from the matching save area. It is thus possible to dispense with access to the memory cells for the data in question.

The above-explained features lower the probability of letting uncorrectable errors take place before a write-back process is performed. This makes it possible to improve the reliability of stored data.

Effecting the write-back process permits retention and retrieval of correct data again while resetting the data retention period of the memory cells at the same time. This further enhances the reliability of the data.

FIGS. 9A and 9B are schematic views showing how, as opposed to ordinary systems, a memory system embodying the present invention can minimize the adverse effect of the write-back process on system performance, without reducing ameliorating effects on data retention characteristics.

FIG. 9A shows the case of an ordinary system in which a write-back process of correct data keeps a memory controller from carrying out a read operation.

By contrast, FIG. 9B shows how the inventive system allows data to be output at a constant rate without keeping the memory controller from effecting read operations.

This memory system embodying the invention is capable of determining the timing at which the host device 100 starts the write-back process.

Illustratively, the memory system allows the data write-back process to take place when the host device 100 does not access the memory.

Figure 10A:
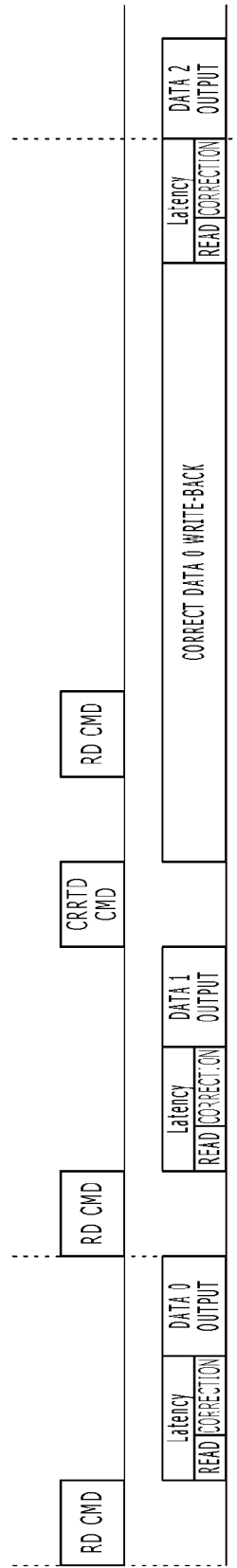
FIGS. 10A and 10B are schematic views comparing the case where the write-back process cannot be stopped, with the case where the write-back process can be stopped as with the embodiment of the invention.
Figure 10B:
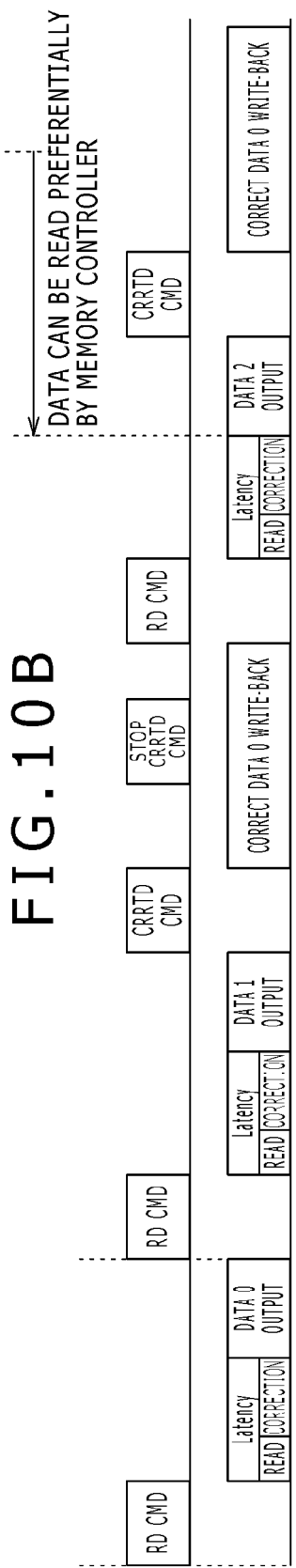

FIGS. 10A and 10B are schematic views comparing the case where the write-back process cannot be stopped, with the case where the write-back process can be stopped as with the embodiment of the invention.

According to the embodiment, as shown in FIG. 10B, a write-back process can be stopped if access to the memory suddenly becomes necessary during that process; the write-back process can be resumed after the access.

The addresses and data of the memory cells where corrections occurred are managed inside the save areas of the memory. There is thus no need for the host device to be equipped with the function of managing such information.

FIGS. 11A and 11B are schematic views comparing the case where all correct data are written back, with the case where correct data at only designated addresses are written back.

When the range of addresses subject to write-back processes is allowed to be selected, it is possible to prevent the occurrence of write-back processes not needed by the host device.

The memory cells where correctable errors occur repeatedly even after write-back processes have been performed are likely to be memory cells with poor data retention characteristics.

These memory cells are detected and reported to the host device. In turn, the host device may utilize the received information on the memory cells as a basis for determining whether or not to continue using the memory cells in question. This feature helps further improve the reliability of data.

The present application contains subject matter related to that disclosed in Japanese Priority Patent Application JP 2009-260705 filed with the Japan Patent Office on Nov. 16, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A nonvolatile memory, comprising:
 a memory area including a data area configured to retain data and an error correction code area configured to retain an error correction code known as ECC; and
 a control unit configured to control access to said memory area, wherein said control unit comprises
  a comparison function configured to match a received read address with an address retained in at least one save area with a validity presentation block set to valid,
   wherein if said comparison function detects a match between said received read address with said address retained in said at least one save area at data read time, then said control unit outputs data from said corresponding address of said at least one save area,
   wherein, if said comparison function detects a mismatch between said received read address with said address retained in said at least one save area, then said control unit reads data from said data area and an error correction code (ECC) from said ECC area and causes an error detection and correction function to check for a data error,
    wherein in case of no data error, said control unit outputs data corresponding to said data from said data area,
    wherein upon detection of said data error, said control unit writes said address and correct data to said corresponding at least one save area, sets said validity presentation block to valid, and outputs said correct data,
  at least one save area configured such that an unmatched received read address, data at a designated address and a corresponding error correction code (ECC) are read from said memory area and if an error is detected in said data, then said detected error is corrected and said save area retains said corrected data corresponding to said address,
   wherein said validity presentation block configured to indicate whether or not said address and said correct data retained in said save area are valid,
   wherein, if a new address and said corrected data are entered into said save area, then said control unit sets said validity presentation block to valid, and if said data retained in said save area becomes unnecessary, then said control unit sets said validity presentation block to invalid; and
  a function configured to give notification that said address and correct data are added anew to said at least one save area.

2. The nonvolatile memory according to claim 1, wherein said control unit includes
 a function configured to give notification that there is no free save area.

3. The nonvolatile memory according to claim 1, wherein said ECC area comprises an error correction code and a save flag.

4. The nonvolatile memory according to claim 3, wherein said save flag facilitates a host device to determine a number of times correct data is stored at said address in said save area.

5. The nonvolatile memory according to claim 4, wherein said host device designates a memory cell corresponding to said address as a defective cell in case said number of times correct data is stored at said address in said save area exceeds a pre-determined threshold.

6. A nonvolatile memory, comprising,
a memory area including a data area configured to retain data and an error correction code area configured to retain an error correction code (ECC); and
a control unit configured to control access to said memory area, said control unit comprising:
an error detection and correction function configured to detect an error in said data read from said data area and to correct said detected error,
a comparison function configured to match a received read address with one or more addresses retained in at least one save area with a validity presentation block set to valid, wherein when said comparison function detects a match between said addresses at data read time, then said control unit outputs said correct data from said corresponding save area,
wherein said at least one save area configured such that for an unmatched received read address, data at a designated address and a corresponding error correction code (ECC) are read from said memory area and if an error is detected in said data, then said detected error is corrected and said save area retains said corrected data corresponding to said address,
said validity presentation block configured to indicate whether or not said address and said correct data retained in said save area are valid,
wherein, if a new address and said corrected data are entered into said save area, then said control unit sets said validity presentation block to valid, and if said data retained in said save area becomes unnecessary, then said control unit sets said validity presentation block to invalid,
wherein, if said comparison function detects a match between said addresses, then said control unit sets to invalid said validity presentation block of said save area that retains said matching address.

7. The nonvolatile memory according to claim 6, wherein said control unit comprises
a function configured to write back to said memory area said data for which said validity presentation block is set to valid in said save areas.

8. The nonvolatile memory according to claim 7, wherein said control unit comprises
a function configured to designate a maximum number of save areas to which to write back data, said maximum number being allowed to be designated in such a manner as to limit a time required to perform said write-back process.

9. The nonvolatile memory according to claim 7, wherein said control unit comprises
a function configured to start said write-back process upon receipt of a write-back command, to set said validity presentation block to invalid upon completion of said process, and to give notification of said completion of said process.

10. The nonvolatile memory according to claim 9, wherein said control unit comprises
a function configured to stop said write-back process upon receipt of a write-back stop command and to resume said stopped write-back process when said write-back command is again received.

11. The nonvolatile memory according to claim 10, wherein said control unit comprises
a function configured to establish an address area targeted for a save process, said function allowing said address area targeted for said save process to be designated upon receipt of a save process target address area set command.

12. The nonvolatile memory according to claim 10, comprising
an area configured to be stored a save flag indicating said address where said save process was performed before in said ECC area of said data area,
wherein said control unit sets said save flag when writing said correct data held in said save areas back to said data area.

13. The nonvolatile memory according to claim 12, wherein said control unit comprises
a function configured to read said data from said data area and said ECC and said save flag from said ECC area at data read time and, upon detection of an error in said retrieved data, to give notification of save flag status in addition to said fact that said address and correct data are added anew to said save areas.

14. A memory system, comprising:
a memory area including a data area configured to retain data and an error correction code area configured to retain an error correction code (ECC);
a control unit configured to control access to said memory area; and
a host device including at least a function configured to designate said control unit to perform a read operation, and a function configured to designate said control unit to perform a write operation,
said control unit comprising:
a comparison function configured to match a received read address with one or more addresses retained in at least one save area with a validity presentation block set to valid,
an error detection and correction function configured to detect an error in said data read from said data area and to correct said detected error,
wherein said at least one save area is configured such that an unmatched received read address, data at a designated address from said host device and a corresponding error correction code (ECC) are read from said memory area, and if an error is detected in said data, said detected error in said data is corrected and said at least one save area retains said corrected data corresponding to said read address, wherein a function is configured to notify said host device that said read address and said corrected data are added anew to said at least one save area, said function further configured to notify said host device that there is no free save area, and
said validity presentation block configured to indicate whether or not said read address and said correct data retained in said at least one save area are valid,
wherein, if a new address and said corrected data are entered into said at least one save area, then said control unit sets said validity presentation block to valid, and if said data retained in said at least one save area becomes unnecessary, then said control unit sets said validity presentation block to invalid.

15. The memory system according to claim 14, wherein said control unit comprises a comparison function configured to detect a match between said received read address with one or more addresses at data read time, said control unit outputs said correct data from said corresponding at least one save area.

16. The memory system according to claim 15, wherein, if said comparison function detects a mismatch between said received read address with one or more addresses, then said control unit reads said data from said data area and said ECC from said ECC area and causes said error detection and correction function to check for a data error and to let said data not needed to be corrected be output unchanged; and
upon detection of said data error, said control unit writes said read address and correct data to said corresponding save area, sets said validity presentation block to valid, and outputs said correct data.

17. A memory system, comprising:
a memory area including a data area configured to retain data and an error correction code area configured to retain an error correction code (ECC);
a control unit configured to control access to said memory area; and
a host device including at least a function configured to designate said control unit to perform a read operation, and a function configured to designate said control unit to perform a write operation,
wherein said control unit comprises:
an error detection and correction function configured to detect an error in said data read from said data area and to correct said detected error,
a comparison function configured to match a received read address with one or more addresses retained in at least one save area with a validity presentation block set to valid, wherein said comparison function configured to detect a match between said addresses at data read time, said control unit outputs said correct data from said corresponding at least one save area,
wherein said at least one save area configured such that an unmatched received read address, data at a designated address from said host device and a corresponding error correction code (ECC) are read from said memory area and if an error is detected in said data, then said detected error is corrected and said save area retains said corrected data corresponding to said address, and
said validity presentation block configured to indicate whether or not said address and said correct data retained in said save area are valid,
wherein, if a new address and said corrected data are entered into said save area, then said control unit sets said validity presentation block to valid, and if said data retained in said save area becomes unnecessary, then said control unit sets said validity presentation block to invalid,
wherein, if said comparison function detects a mismatch between said addresses, then said control unit reads said data from said data area and said ECC from an ECC area and causes said error detection and correction function to check for a data error and to let said data not needed to be corrected be output unchanged, and
upon detection of said data error, said control unit writes said address and correct data to said corresponding at least one save area, sets said validity presentation block to valid, and outputs said corrected data,
wherein said control unit comprises:
a function configured to notify said host device that said address and said corrected data are added anew to said at least one save area; and
a function configured to notify said host device that there is no free save area.

18. The memory system according to claim 17, wherein said control unit comprises:
a function configured such that, if said comparison function detects a match between said addresses, then said function sets to invalid said validity presentation block of said save area that retains said matching address;
a function configured to write back to said memory area said data for which said validity presentation block is set to valid in said save areas; and
a function configured to designate a maximum number of save areas to which to write back data,
wherein said host device may designate said maximum number of save areas in such a manner as to limit said time required to perform said write-back process.

19. The memory system according to claim 18, wherein said control unit comprises:
a function configured to start said write-back process upon receipt of a write-back command from said host device, to set said validity presentation block to invalid upon completion of said process, and to give notification of said completion of said process; and
a function configured to stop said write-back process upon receipt of a write-back stop command from said host device,
wherein said control unit resuming said stopped write-back process when said write-back command is again received from said host device.

20. The memory system according to claim 19, comprising an area configured to be stored a save flag indicating said address where said save process was performed before in said ECC area,
wherein said control unit comprises a function configured to establish an address area targeted for a save process, said function allowing said address area targeted for said save process to be designated by a save process target address area set command from said host device;
said control unit sets said save flag when writing said correct data held in said save areas back to said data area; and
said control unit further comprises a function configured to read said data from said data area and said ECC and said save flag from said ECC area at data read time, said function further notifying said host device of save flag status in addition to said fact that said address and correct data are added anew to said save areas if an error is detected in said retrieved data, said function further notifying said host device of said unavailability of said save areas if there is no free save area.

* * * * *